(12) United States Patent
Ishii et al.

(10) Patent No.: US 7,495,178 B2
(45) Date of Patent: Feb. 24, 2009

(54) SUSPENSION BOARD WITH CIRCUIT

(75) Inventors: Jun Ishii, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 28 days.

(21) Appl. No.: 11/713,053

(22) Filed: Mar. 2, 2007

(65) Prior Publication Data
US 2007/0209829 A1    Sep. 13, 2007

(30) Foreign Application Priority Data
Mar. 2, 2006    (JP) ............................. 2006-056647

(51) Int. Cl.
*H05K 1/03*    (2006.01)
(52) U.S. Cl. .................. 174/255; 174/260; 360/245.9
(58) Field of Classification Search ................. 174/254, 174/261; 360/245.9
See application file for complete search history.

(56) References Cited

U.S. PATENT DOCUMENTS

| | | | |
|---|---|---|---|
| 5,858,518 A | 1/1999 | Omote et al. | |
| 6,096,482 A | 8/2000 | Omote et al. | |
| 6,100,582 A | 8/2000 | Omote et al. | |
| 6,351,351 B1 * | 2/2002 | Takasugi | 360/245.9 |
| 6,459,043 B1 * | 10/2002 | Dodsworth | 174/254 |
| 6,995,954 B1 * | 2/2006 | Coon | 360/245.9 |
| 2006/0118905 A1 * | 6/2006 | Himori et al. | 257/531 |
| 2006/0187587 A1 * | 8/2006 | Arai et al. | 360/245.9 |

FOREIGN PATENT DOCUMENTS

| | | |
|---|---|---|
| JP | 8-153940 | 6/1996 |
| JP | 10-12983 | 1/1998 |

* cited by examiner

*Primary Examiner*—Ishwar I. B. Patel
(74) *Attorney, Agent, or Firm*—Jean C. Edwards, Esq.; Akerman Senterfitt

(57) ABSTRACT

A suspension board with circuit has a metal supporting board, an insulating layer formed on the metal supporting board, a conductive pattern formed on the insulating layer and including a terminal portion for connecting to an external terminal, and an antistatic barrier layer formed on the conductive pattern. The antistatic barrier layer includes a metal thin film and a semiconductive layer having at least one end facing the terminal portion and at least the other end in contact with the metal supporting board.

5 Claims, 5 Drawing Sheets

(a)

(b)

(c)

(d)

(e)

(f)

(g)

(h)

SUSPENSION BOARD WITH CIRCUIT

CROSS-REFERENCE TO RELATED APPLICATION

The present application claims priority from Japanese Patent Application No. 2006-56647 filed on Mar. 2, 2006, the content of which is hereby incorporated by reference into this application.

BACKGROUND OF THE INVENTION

1. Field of the Invention

The present invention relates to a suspension board with circuit and, more particularly, to a suspension board with circuit on which an electronic component is mounted.

2. Description of Related Art

A suspension board with circuit which is mounted on a hard disk drive typically comprises a metal supporting board, an insulating base layer formed on the metal supporting board, a conductive pattern formed on the insulating base layer, and an insulating cover layer formed on the insulating base layer to cover the conductive pattern. Such a suspension board with circuit is widely used in various electric and electronic equipment.

To prevent diffusion (ion migration) of copper for forming a copper conductive layer into an insulating cover layer in such a suspension board with circuit and thereby prevent the degradation of the copper conductive layer as well as a short circuit between the copper conductive layers, it has been proposed to form a nickel thin film on a surface of the copper conductive layer by electroless nickel plating, thereby coating and protecting the surface of the copper conductive layer (see, e.g., Japanese Unexamined Patent Publication No. 10-12983).

When an electronic component is mounted on a wired circuit board such as a suspension board with circuit, the electronic component may be occasionally broken down by static electricity in the mounting step.

To prevent this, it has been proposed to form a metal layer on a surface of a base film or a cover film in, e.g., a flexible circuit board by vapor deposition, sputtering, electroless plating, or like method, thereby grounding or reducing static electricity (see, e.g., Japanese Unexamined Patent Publication No. 08-153940).

SUMMARY OF THE INVENTION

In the suspension board with circuit, an opening is formed in the insulating cover layer and a terminal portion for mounting the electronic component is provided as the portion of a conductive pattern exposed from the opening.

In particular, in the step of mounting the electronic component, there is a case where the terminal portion (i.e., the exposed portion of the conductive pattern) is slightly charged with static electricity. When the terminal portion is charged with static electricity, the electronic component mounted thereon may be broken down by the static electricity.

Therefore, it is desired to prevent ion migration in the copper conductive layer as described in Japanese Unexamined Patent Publication No. 10-12983 and prevent the electrostatic charging of the terminal portion described above.

However, when an attempt is made to provide both of the nickel thin film for preventing ion migration in the copper conductive layers as described in Japanese Unexamined Patent Publication No. 10-12983 and the metal layer for preventing electrostatic charging as described in Japanese Unexamined Patent Publication No. 08-153940 on the conductive pattern of the suspension board with circuit, it is difficult to set a surface resistance value in a range required to remove the electrostatic charging of the terminal portion because the nickel thin film and the metal layer have different purposes.

It is therefore an object of the present invention to provide a suspension board with circuit wherein ion migration in a conductive pattern can be effectively prevented and the electrostatic charging of a terminal portion can be effectively prevented.

A suspension board with circuit according to the present invention comprises a metal supporting board, an insulating layer formed on the metal supporting board, a conductive pattern formed on the insulating layer and including a terminal portion for connecting to an external terminal, and an antistatic barrier layer formed on the conductive pattern, wherein the antistatic barrier layer includes a metal thin film and a semiconductive layer having at least one end facing the terminal portion and at least the other end in contact with the metal supporting board.

In the suspension board with circuit according to the present invention, the antistatic barrier layer includes the metal thin film and the semiconductive layer. As a result, it is possible to effectively prevent ion migration in the conductive pattern by means of the metal thin film. In addition, it is possible to set a surface resistance value in a range required to remove the electrostatic charging of the terminal portion by means of the semiconductive layer. This allows simultaneous and effective prevention of ion migration in the conductive pattern and the electrostatic charging of the terminal portion. Therefore, the degradation of the conductive patterns and a short circuit between the conductive patterns as well as the electrostatic breakdown of an electronic component mounted on the terminal portion can be prevented simultaneously and effectively.

In the suspension board with circuit according to the present invention, it is preferable that the metal thin film is a nickel thin film.

In the suspension board with circuit according to the present invention, it is preferable that the semiconductive layer is a chromium oxide layer.

It is preferable that the suspension board with circuit according to the present invention further comprises an insulating cover layer formed on the antistatic barrier layer to cover the conductive pattern.

In the suspension board with circuit according to the present invention, it is preferable that the metal thin film is formed continuously over upper and side surfaces of the conductive pattern and the semiconductive layer is formed continuously over upper and side surfaces of the metal thin film and upper and side surfaces of the insulating layer exposed from the metal thin film.

DESCRIPTION OF THE PREFERRED EMBODIMENTS

Figure 1:
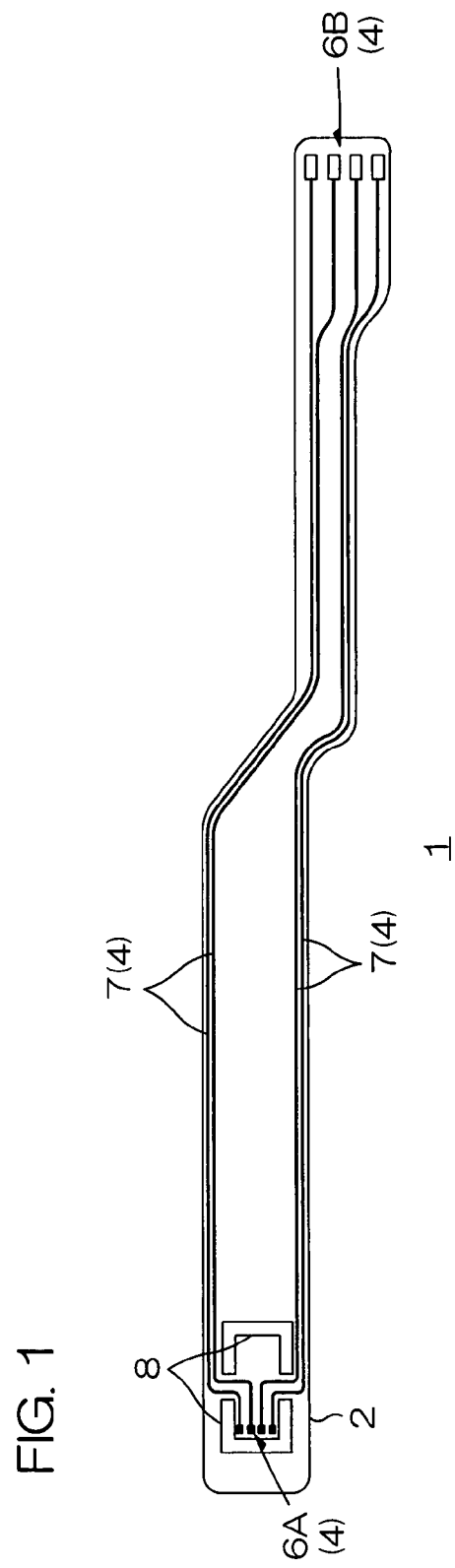
FIG. 1 is a schematic plan view showing an embodiment of a suspension board with circuit according to the present invention.
Figure 2:
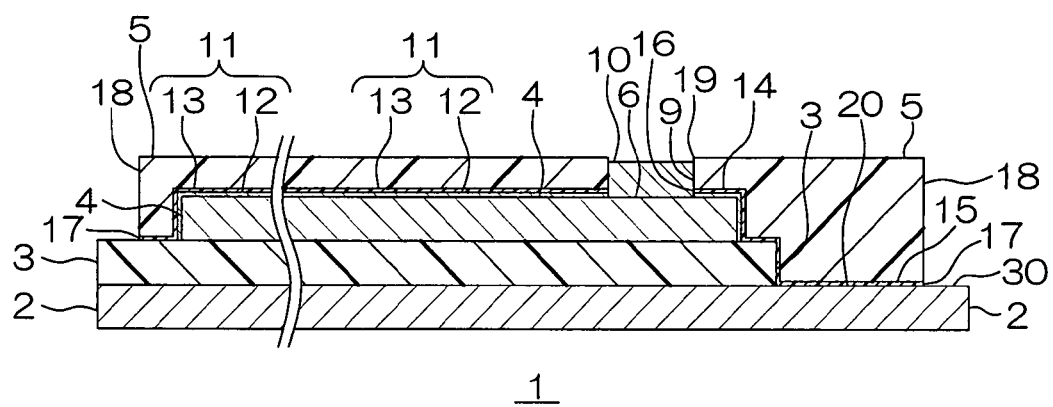
FIG. 2 is a partial cross-sectional view along the longitudinal direction of a wire shown in FIG. 1.

FIG. 1 is a schematic plan view showing an embodiment of a suspension board with circuit according to the present invention. FIG. 2 is a partial cross-sectional view along the longitudinal direction of a wire shown in FIG. 1

In FIG. 1, a suspension board with circuit 1 comprises a metal supporting board 2 mounted on a hard disk drive. A conductive pattern 4 connecting a magnetic head and a read/write board 2 is formed integrally on the metal supporting board 2. The metal supporting board 2 supports the magnetic head mounted thereon, while holding a minute gap between the magnetic head and a magnetic disk against an air flow caused when the magnetic head and the magnetic disk travel relatively to each other.

In FIG. 1, an insulating base layer 3 as an insulating layer, an insulating cover layer 5, and an antistatic barrier layer 11, which are described later, are not shown for clear illustration of a relative position of the conductive pattern 4 to the metal supporting board 2.

The conductive pattern 4 comprises magnetic-head-side connection terminal portions 6A, external connection terminal portions 6B, and wires 7 for connecting the magnetic-head-side connection terminal portions 6A and the external connection terminal portions 6B, which are formed integrally and continuously.

The plurality of wires 7 are provided in the longitudinal direction of the metal supporting board 2 and arranged in mutually parallel and spaced-apart relation in the widthwise direction (direction orthogonal to the longitudinal direction) thereof The plurality of magnetic-head-side connection terminal portions 6A are provided and arranged at the front end portion of the metal supporting board 2 and connected individually to the respective front end portions of the wires 7. To the magnetic-head-side connection terminal portions 6A, terminal portions (not shown) as the external terminals of the magnetic head are connected.

The plurality of external connection terminal portions 6B are provided and arranged at the rear end portion of the metal supporting board 2 and connected individually to the respective rear end portions of the wires 7. To the external connection terminal portions 6B, terminal portions (not shown) as the external terminal portions of the read/write board are connected.

The front end portion of the metal supporting board 2 is provided with a gimbal 8 for mounting the magnetic head. The gimbal 8 is formed by cutting away the metal supporting board 2 to sandwich the magnetic-head-side connection terminal portions 6A in the longitudinal direction.

As shown in FIG. 2, the suspension board with circuit 1 comprises the metal supporting board 2, the insulating base layer 3 formed on the metal supporting board 2, the conductive pattern 4 formed on the insulating base layer 3, and the insulating cover layer 5 formed on the insulating base layer 3 and the metal supporting board 2.

In the insulating cover layer 5, openings 9 are formed to extend therethrough in the thickness direction in correspondence to the portions at which the magnetic-head-side connection terminal portions 6A or the external connection terminal portions 6B are arranged. The portions of the conductive pattern 4 exposed from the openings 9 are provided as the magnetic-head-side connection terminal portions 6A or the external connection terminal portions 6B (hereinafter generally referred to as terminal portions 6). In FIG. 2, only either of the magnetic head-side connection terminal portions 6A or the external connection terminal portions 6B is shown.

In the suspension board with circuit 1, an antistatic barrier layer 11 is formed on the metal supporting board 2, the insulating base layer 3, and the conductive pattern 4 to be interposed between the insulating cover layer 5, the metal supporting board 2, the insulating base layer 3, and the conductive pattern 4.

The antistatic barrier layer 11 comprises a metal thin film 12 and a semiconductive layer 13.

The metal thin film 12 is formed continuously on the upper surface (except for the terminal portion 6) of the conductive pattern 4 and the side surface (including the lower end portion laminated on the upper surface of the insulating base layer 3) thereof to cover the conductive pattern 4.

The semiconductive layer 13 is formed continuously on the upper and side surfaces of the metal thin film 12, the upper and side surfaces of the insulating base layer 3 exposed from the metal thin film 12, and the upper surface of the metal supporting board 2 exposed from the insulating base layer 3.

The semiconductive layer 13 is also formed to cover the metal thin film 12, the portion of the insulating base layer 3 exposed from the metal thin film 12, and the portion of the metal supporting board 2 exposed from the insulating base layer 3. It is to be noted that, on the semiconductive layer 13 (i.e., on the upper surface of the semiconductive layer 13 formed on the upper surface of the metal thin film 12, the side surfaces of the semiconductive layer 13 formed on the side surfaces of the metal thin film 12, the upper surface of the semiconductive layer 13 formed on the upper surface of the insulating base layer 3 exposed from the metal thin film 12, the side surface of the semiconductive layer 13 formed on the side surface of the insulating base layer 3 exposed from the metal thin film 12, and the upper surface of the semiconductive layer 13 formed on the upper surface of the metal supporting board 2 exposed from the insulating base layer 3), the insulating cover layer 5 is formed to cover the semiconductive layer 13.

The semiconductive layer 13 has one end portion 14 as one longitudinally inner end adjacent to the terminal portion 6, which is formed to face the terminal portion 6 from the opening 9 such that the inner edge 16 of the one end portion 14 is flush with the aperture edge 19 of the opening 9 when viewed in plan view. The semiconductive layer 13 also has the other end portion 15 as the longitudinally other outer end such that the outer edge 17 of the other end portion 15 is flush with the cover edge 18 of the insulating cover layer 5 when viewed in plan view. The semiconductive layer 13 (including the other end portion 15 of the semiconductive layer 13 and the lower end portion thereof formed on the side surface of the insulating base layer 3 and laminated on the upper surface of the metal supporting board 2) which is formed on the upper surface of the metal supporting board 2 covered with the insulating cover layer 5 is in contact with the metal supporting board 2.

In the semiconductive layer 13, the one end portion 14 is electrically connected to the conductive pattern 4 via a metal plating layer 10, which is described later, and the metal thin film 12, while the other end portion 15 is electrically connected to the metal supporting board 2.

The metal plating layer 10 is formed on the upper surface of the terminal portion 6.

The opening 9 is filled with the metal plating layer 10 to come in contact with the metal thin film 12 and the semiconductive layer 13 of the antistatic barrier layer 11 at the aperture edge 19 of the opening 9 in the insulating cover layer 5.

Figure 3:
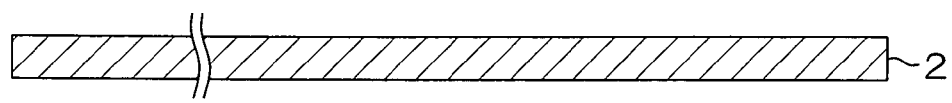
FIG. 3 is a production process diagram showing a method for producing the suspension board with circuit according to the embodiment of the present invention, (a) showing the step of preparing a metal supporting board, (b) showing the step of forming an insulating base layer in a pattern on the upper surface of the metal supporting board, (c) showing the step of forming a conductive pattern on the upper surface of the insulating base layer, and (d) shows the step of continuously forming a metal thin film on the upper and side surfaces of the conductive pattern.
Figure 3:
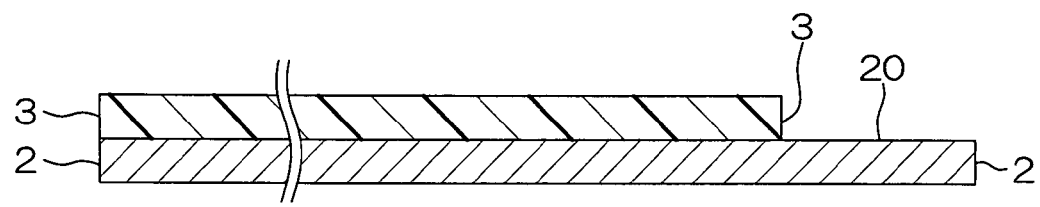
Figure 3:
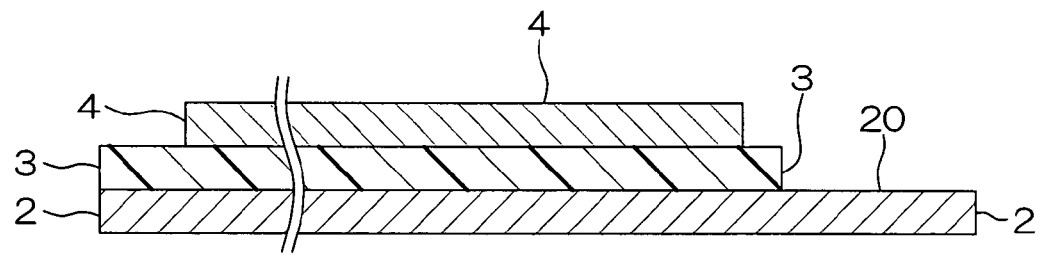
Figure 3:
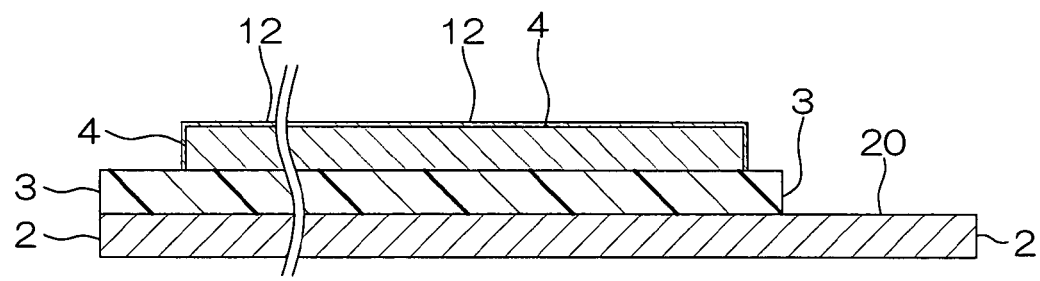
Figure 4:
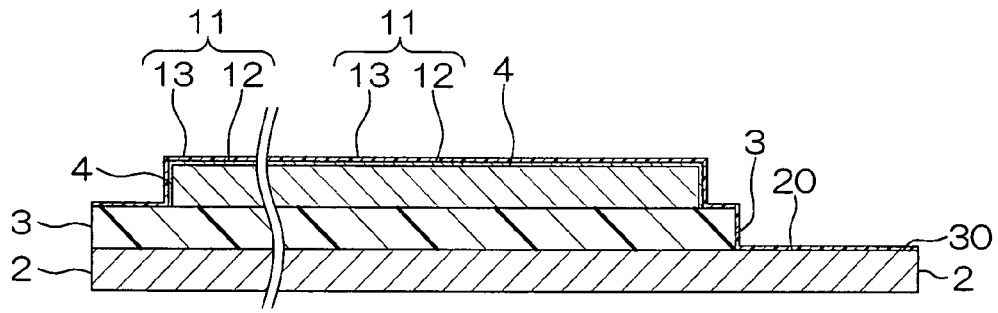
FIG. 4 is a production process diagram showing subsequently to FIG. 3, the method for producing the suspension board with circuit according to the embodiment of the present invention, (e) showing the step of continuously forming a semiconductive layer on the upper and side surfaces the metal thin film, the upper and side surfaces of the insulating base layer exposed from the metal thin film, and the upper surface of the metal supporting board exposed from the insulating base layer, (f) showing the step of forming an insulating cover layer on the semiconductive layer of an antistatic barrier layer, (g) showing the step of etching away the portions of the semiconductive layer and the metal thin film exposed from an opening of the insulating cover layer, the semiconductive layer formed on the upper surface of the insulating base layer exposed from the insulating cover layer, and the semiconductive layer formed on the upper surface of the metal supporting board exposed from the insulating cover layer, and (h) showing the step of forming a metal plating layer on the surface of a terminal portion.
Figure 4:
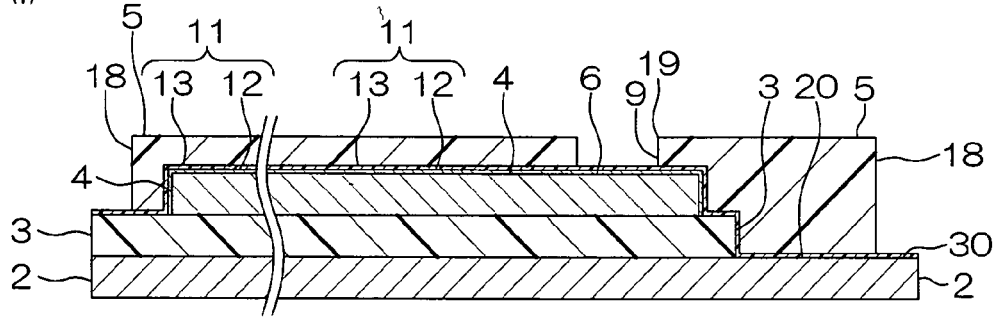
Figure 4:
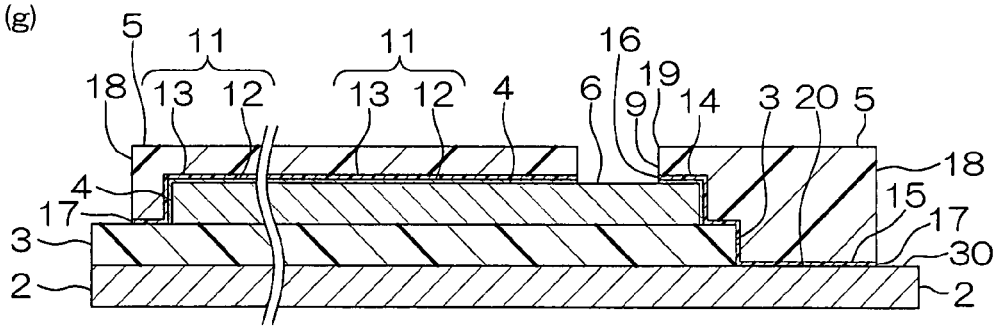
Figure 4:
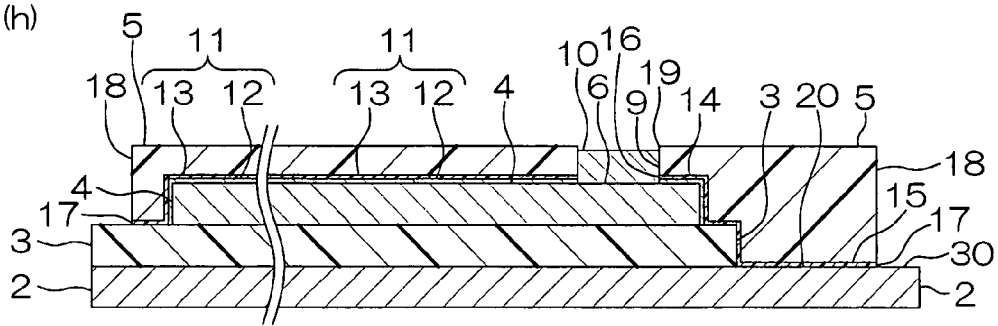

Next, a description is given to a method for producing the suspension board with circuit 1 with reference to FIGS. 3 and 4.

As shown in FIG. 3(a), the metal supporting board 2 is prepared first. For the metal supporting board 2, a metal foil such as, e.g., a stainless steel foil, a 42-alloy foil, an aluminum foil, a copper-beryllium foil, or a phosphor bronze foil is used, although preferably, a stainless steel foil is used. The thickness of the metal supporting board 2 is in the range of, e.g., 5 to 100μm.

Next, as shown in FIG. 3(b), the insulating base layer 3 is formed on the upper surface of the metal supporting board 2 to provide a pattern in which, e.g., the outer peripheral portion 20 of the upper surface of the metal supporting board 2 on the other longitudinal side (right-hand side of FIG. 3(b)) is partly exposed The insulating base layer 3 is made of a resin such as, e.g., a polyimide resin, a polyamideimide resin, an acrylic resin, a polyethernitrile resin, a polyethersulfone resin, a polyethylene terephthalate resin, a polyethylene naphthalate resin, or a polyvinyl chloride resin. In terms of heat resistance, the insulating base layer 3 is preferably made of a polyimide resin. The thickness of the insulating base layer 3 is in the range of, e.g., 5 to 50 μm, or preferably 10 to 30 μm.

The method for forming the insulating base layer 3 in the pattern is not particularly limited and a known method is used. For example, a varnish of a photosensitive resin (photosensitive polyamic acid resin) is coated on a surface of the metal supporting board 2 and the coated varnish is dried to form a base coating. Then, the base coating is exposed to light via a photomask, heated as necessary, and developed to form the pattern. Thereafter, the pattern is heated at a temperature of, e.g., 250° C. or more under a reduced pressure to be cured (imidized).

Next, as shown in FIG. 3(c), the conductive pattern 4 is formed on the upper surface of the insulating base layer 3 . The conductive pattern 4 is made of, e.g., a conductive material such as, e.g., copper, nickel, gold, a solder, or an alloy thereof, although preferably, made of copper. The conductive pattern 4 is formed on the upper surface of the insulating base layer 3 by a known patterning method such as, e.g., a subtractive method or an additive method. Preferably, the conductive pattern 4 is formed by the additive method as a wired circuit pattern integrally formed with the terminal portion 6 and the wire 7 described above.

In the subtractive method, a conductive layer is laminated first on the upper surface of the insulating base layer 3 via an adhesive layer as necessary. Then, an etching resist having the same pattern as the wired circuit pattern is formed on the conductive layer and, using the etching resist as a resist, the conductive layer is etched. Thereafter, the etching resist is removed.

In the additive method, a conductive thin film is formed first on the entire surface (upper and side surfaces) of the insulating base layer 3. To form the conductive thin film, a chromium thin film and a copper thin film are laminated in layers by sputtering, or preferably by chromium sputtering and copper sputtering.

Then, a plating resist is formed in a pattern reverse to the wired circuit pattern on the upper surface of the conductive thin film. Then, the conductive pattern 4 is formed as the wired circuit pattern on the upper surface of the conductive thin film exposed from the plating resist by electrolytic plating. Thereafter, the plating resist and the portion of the conductive film on which the plating resist is laminatd are removed.

The conductive pattern 4 thus formed has a thickness in the range of, e.g., 3 to 50 μm, or preferably 5 to 20 μm. Each of the wires 7 has a width in the range of, e.g., 10 to 200 μm. The spacing between the wires 7 is in the range of, e.g., 10 to 200 μm.

The terminal portion 6 has a width in the range of, e.g., 10 to 300 μm, or preferably 20 to 100 μm. The spacing between the terminal portions 6 is in the range of, e.g., 10 to 300 μm, or preferably 20 to 100 μm.

Next, as shown in FIG. 3(d), the metal thin film 12 is formed continuously on the upper and side surfaces (including the lower end portion laminated on the upper surface of the insulating base layer 3) of the conductive pattern 4 to cover the conductive pattern 4. The metal thin film 12 is made of a metal such as, e.g., nickel, gold, tin, chromium, titanium, zirconium, or an alloy thereof, although preferably, made of nickel.

The metal thin film 12 is formed continuously on the upper and side surface of the conductive pattern 4 to cover the conductive pattern 4 by, e.g., an electrolytic or electroless plating method, a sputtering method using any of the metals listed above as a target, or the like. Preferably, the metal thin film 12 is formed by electroless plating.

In the electroless plating method, the suspension board with circuit 1 in the production process shown in FIG. 3(c) is dipped in a plating solution of the metal listed above to form the metal thin film 12.

The metal thin film 12 thus formed has a thickness in the range of, e.g., 0.01 to 0.5 μm, or preferably 0.05 to 0.3 μm. When the thickness of the metal thin film 12 is in the foregoing range, an effective surface resistance value can be obtained in the antistatic barrier layer 11. When the thickness of the metal thin film 12 is under the foregoing range, there is a case where ion migration in the conductive pattern 4 cannot be effectively prevented. Conversely, when the thickness of the metal thin film 12 is over the foregoing range, there is a case where an effective surface resistance value cannot be obtained in the antistatic barrier layer 11, though ion migration in the conductive pattern 4 can be effectively prevented.

Next, as shown in FIG. 4(e), the semiconductive layer 13 is formed continuously on the upper and side surfaces of the metal thin film 12, the upper and side surfaces of the insulating base layer 3 exposed from the metal thin film 12, and the upper surface of the metal supporting board 2 exposed from the insulating base layer 3.

The material of the semiconductive layer 13 is not particularly limited. For example, the semiconductive layer 13 is composed of a resin layer or a metal layer having a surface resistance value in the range of $1 \times 10^5$ to $1 \times 10^{13}$ Ω/□. Specifically, the semiconductive layer 13 is composed of a resin layer in which conductive particles such as carbon particles, metal particles, metal oxide particles, or the like are dispersed, a metal oxide layer, or the like. Preferably, the semiconductive layer 13 is composed of a metal oxide layer.

The metal oxide layer is made of a metal oxide such as, e.g., chromium oxide, nickel oxide, copper oxide, titanium oxide, zirconium oxide, indium oxide, aluminum oxide, or zinc oxide, although preferably made of chromium oxide. The chromium oxide can form a metal oxide layer having a stable surface resistance value which is less likely to change even under high-temperature and high-humidity conditions.

The degree of oxidation of a metal in a metal oxide layer differs depending on a method for forming the metal oxide layer described below. The metal may be oxidized either uniformly in the thickness direction of the metal oxide layer or such that the degree of oxidation is highest at the outermost surface thereof and decreased gradually with distance from the outermost surface toward the inward of the thickness direction.

The method for forming a metal oxide layer is not particularly limited. For example, the method such as a method of oxidizing a metal as a target after sputtering by heating as necessary, a method of reactive sputtering, a method of sputtering using a metal oxide as a target, or the like is used.

In the method of oxidizing a metal as a target after sputtering by heating as necessary, the upper and side surfaces of the metal thin film 12, the upper and side surfaces of the insulating base layer 3 exposed from the metal thin film 12, and the upper surface of the metal supporting board 2 exposed from the insulating base layer 3 are sputtered first using a metal as a target.

Figure 5:
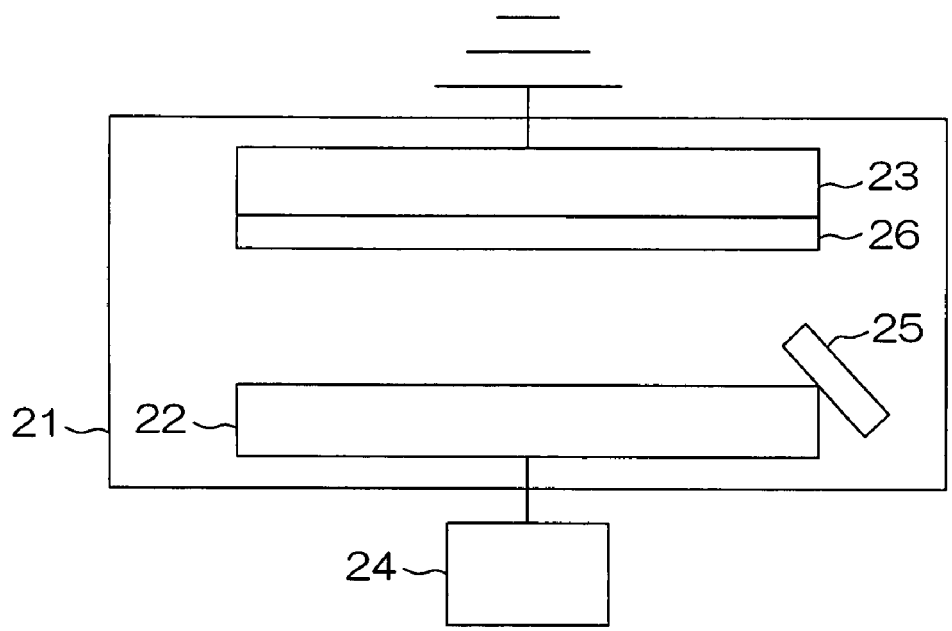
FIG. 5 is a schematic structural view showing an embodiment of a sputtering apparatus.

For the sputtering, the sputtering apparatus shown in FIG. 5, e.g., is used. That is, in FIG. 5, a target 22 and an earth electrode 23 are arranged to face in mutually spaced-apart facing relation in a vacuum chamber 21. A power source 24 is connected to the target 22, while a plasma emission monitor 25 is disposed to allow a plasma to be emitted toward the target 22. The power source 24 is not particularly limited. A pulse power source, a direct current (DC) power source, an alternate current (RF) power source, or the like is used appropriately.

The earth electrode 23 is grounded and a board 26 (equivalent to the suspension board with circuit 1 in the production process shown in FIG. 3(d), placed in a state that the side of the board 26 on which the conductive pattern 4 is arranged faces the target 22) is disposed on the surface thereof For the target 22, e.g., chromium, nickel, copper, titanium, aluminum, tantalum, lead, zinc, zirconium, gallium, indium, or an alloy thereof is used, although preferably, chromium is used.

An inert gas such as argon is introduced into the vacuum chamber 21 and electric power is applied from the power source 24 to form a plasma from the introduced gas so that the target 22 is sputtered for a predetermined time, while the emission intensity of the plasma is held constant by the plasma emission monitor 25. In this manner, a sputtering coating is formed on the upper and side surfaces of the metal thin film 12, the upper and side surfaces of the insulating base layer 3 exposed from the metal thin film 12, and the upper surface of the metal supporting board 2 exposed from the insulating base layer 3.

An example of sputtering conditions for the sputtering using such metal as a target is shown below.

Ultimate of Vacuum: $1.33 \times 10^{-5}$ to $1.33 \times 10^{-2}$ Pa

Flow Rate of Introduced Gas (Ar): $1.2 \times 10^{-3}$ to $4 \times 10^{-3}$ m³/hour Operating Pressure (Degree of Vacuum After Gas Introduction):

$1.33 \times 10^{-2}$ to 1.33 Pa

Temperature of Earth Electrode: 10 to 100° C.

Electric Power: 100 to 2000 W

Sputtering Time: 1 Second to 15 Minutes

More specifically, a known sputtering method such as a direct current sputtering method, a radio frequency sputtering method, a magnetron sputtering method, or a composite sputtering method thereof is selected appropriately for such sputtering.

Then, the method for oxidizing the sputtering coating by heating as necessary is not particularly limited. For example, the sputtering coating is heated in a heating furnace in the atmosphere or the like. The heating temperature is in the range of, e.g., 50 to 400° C., or preferably 100 to 250° C. The heating time is, e.g., in the range of one minute to twelve hours. In this manner, the semiconductive layer 13 composed of a metal oxide layer is formed on the upper and side surfaces of the metal thin film 12, the upper and side surfaces of the insulating base layer 3 exposed from the metal thin film 12, and the upper surface of the portion of the metal supporting board 2 exposed from the insulating base layer 3, as shown in FIG. 4(e).

In the case where the sputtering coating is naturally oxidized upon exposure to the atmosphere, the sputtering coating need not particularly be heated or may be heated to form a stable metal oxide layer.

The metal in the metal oxide layer is oxidized such that the degree of oxidation is highest at the outermost surface of the metal oxide layer and decreased gradually with distance from the outermost surface toward the inward of the thickness direction thereof.

In the method of reactive sputtering, the same sputtering method as described above is used except that a gas containing oxygen is introduced into the vacuum chamber 21 in the sputtering apparatus shown in FIG. 5 described above.

More specifically, the same metal as used to form the sputtering coating described above is used as the target 22 and the suspension board with circuit 1 in the production process shown in FIG. 3(d) is placed as the board 26 so that the side of the board 26 on which the conductive pattern 4 is arranged faces the target 22.

Then, a reactive gas (e.g., Ar/O$_2$ gas mixture or N$_2$/O$_2$ gas mixture) in which oxygen is essentially contained and argon or nitrogen is mixed at an arbitrary ratio is introduced and electric power is applied from the power source 24 to form a plasma from the introduced gas such that the target 22 is sputtered for a predetermined time, while the emission intensity of the plasma is held constant by the plasma emission monitor 25.

In this manner, the semiconductive layer 13 composed of a metal oxide layer is formed on the upper and side surfaces of the metal thin film 12, the upper and side surfaces of the insulating base layer 3 exposed from the metal thin film 12, and the upper surface of the metal supporting board 2 exposed from the insulating base layer 3, as shown in FIG. 4(e). The metal in the metal oxide layer is oxidized uniformly in the thickness direction thereof.

An example of sputtering conditions for the reactive sputtering is shown below.

Ultimate of Vacuum: $1.33 \times 10^{-5}$ to $1.33 \times 10^{-2}$ Pa
Flow Rate of Introduced Gas in $Ar/O_2$ Gas Mixture:
Ar: $1.2 \times 10^{-3}$ to $2.4 \times 10^{-3}$ m$^3$/hour
$O_2$: $6 \times 10^{-5}$ to $30 \times 10^{-5}$ m$^3$/hour
or
Flow Rate of Introduced Gas in $N_2/O_2$ Gas Mixture:
$N_2$: $1.2 \times 10^{-3}$ to $2.4 \times 10^{-3}$ m$^3$/hour
$O_2$: $6 \times 10^{-5}$ to $30 \times 10^{-5}$ m$^3$/hour
Operating Pressure (Degree of Vacuum After Gas Introduction):
$1.33 \times 10^{-2}$ to 1.33 Pa
Temperature of Earth Electrode: 10 to 100° C.
Electric Power: 100 to 2000 W
Sputtering Time: 3 Seconds to 15 Minutes In the method of sputtering using a metal oxide as a target, the same sputtering method as described above is used except that the metal oxide is used as the target 22 in the sputtering apparatus shown in FIG. 5 described above and an AC power source is used as the power source 24. Examples of the metal oxide used as the target 22 include chromium oxide, zirconium oxide, silicon oxide, tin oxide, titanium oxide, magnesium oxide, or aluminum oxide, or preferably, chromium oxide is used.

More specifically, any of the metal oxides listed above is used and the suspension board with circuit 1 in the production process shown in FIG. 3(d) is placed as the board 26 so that the side of the board 26 on which the conductive pattern 4 is arranged faces the target 22.

Then, an inert gas such as argon is introduced into the vacuum chamber 21 and electric power is applied from the power source 24 to form a plasma from the introduced gas so that the target 22 is sputtered for a predetermined time, while the emission intensity of the plasma is held constant by the plasma emission monitor 25. In this manner, the semiconductive layer 13 composed of a metal oxide layer is formed on the upper and side surfaces of the metal thin film 12, the upper and side surfaces of the insulating base layer 3 exposed from the metal thin film 12, and the upper surface of the metal supporting board 2 exposed from the insulating base layer 3, as shown in FIG. 4(e). The metal in the metal oxide layer is oxidized uniformly in the thickness direction thereof.

An example of sputtering conditions for the sputtering using a metal oxide as a target is shown below.

Ultimate of Vacuum: $1.33 \times 10^{-5}$ to $1.33 \times 10^{-2}$ Pa
Flow Rate of Introduced Gas (Ar): $1.2 \times 10^{-3}$ to $4 \times 10^{-3}$ m$^3$/hour
Operating Pressure (Degree of Vacuum After Gas Introduction):
$1.33 \times 10^{-2}$ to 1.33 Pa
Temperature of Earth Electrode: 10 to 100° C.
Electric Power: RF 100 to 2000 W
Sputtering Time: 1 Second to 15 Minutes The semiconductive layer 13 thus formed has a thickness set to a value in the range of, e.g., 0.005 to 0.05 µm, or preferably 0.01 to 0.02 µm. When the thickness of the semiconductive layer 13 is in the foregoing range, an effective surface resistance value can be obtained in the antistatic barrier layer 11. The semiconductive layer 13 (the portion formed on the upper and side surfaces of the insulating base layer 3 and the upper surface of the metal supporting board 2) has the surface resistance value in the range of, e.g., not less than $1 \times 10^5$ Ω/□, or preferably not less than $1 \times 10^7$ Ω/□, and normally not more than $1 \times 10^{13}$ Ω/□.

When the surface resistance value of the antistatic barrier layer 11 is under the foregoing range, there is a case where the misoperation of the mounted electronic component may occur. When the surface resistance value of the antistatic barrier layer 11 is over the foregoing range, there is a case where electrostatic breakdown cannot be prevented.

Then, the insulating cover layer 5 is formed on the semiconductive layer 13 of the antistatic barrier layer 11.

The insulating cover layer 5 is formed such that the opening 9 from which the terminal portion 6 is exposed is formed. The insulating cover layer 5 is also formed in a pattern in which the outer peripheral edge 30 of the outer peripheral portion 20 on the other longitudinal side (right-hand side in FIG. 4(g)) is exposed, as shown in FIG. 4(g).

The method for forming the insulating cover layer 5 in the pattern is not particularly limited and a known method is used. For example, a varnish of a photosensitive resin (photosensitive polyamic acid resin) is coated on the surface of the semiconductive layer 13 of the antistatic barrier layer 11 and the coated varnish is dried to form a cover coating. Then, the cover coating is exposed to light via a photomask, heated as necessary, and developed to form the pattern. Thereafter, the pattern is heated at a temperature of, e.g., 250° C. or more under a reduced pressure to be cured (imidized).

The longitudinal length of the opening 9 is set to a value in the range of, e.g., 10 to 1000 µm, or preferably 100 to 500 µm. The widthwise length of the opening 9 is set to a value in the range of, e.g., 10 to 300 µm, or preferably 20 to 100 µm.

Next, as shown in FIG. 4(g), the respective portions are etched away such as the portion of the semiconductive layer 13 and the metal thin film 12 of the antistatic barrier layer 11 exposed from the opening 9 in the insulating cover layer 5, the portion of the semiconductive layer 13 of the antistatic barrier layer 11 which is formed on the upper surface of the insulating base layer 3 exposed from the insulating cover layer 5, and the portion of the semiconductive layer 13 of the antistatic barrier layer 11 which is formed on the upper surface of the metal supporting board 2 exposed from the insulating cover layer 5.

In the etching, the portion of the antistatic barrier layer 11 to be etched is removed by wet etching using an etching solution and the insulating cover layer 5 covering the antistatic barrier layer 11 as an etching resist.

The etching solution is selected appropriately depending on the semiconductive layer 13 and the metal thin film 12 of the antistatic barrier layer 11. When the semiconductive layer 13 is made of, e.g., chromium oxide and the metal thin film 12 is made of, e.g., nickel, an etching solution mainly containing potassium ferricyanide, potassium permanganate, sodium metasilicate, cerium ammonium nitrate, a hydrochloric acid, a sulfuric acid, a nitric acid, or the like is used.

As a result of etching, the semiconductive layer 13 and the metal thin film 12 exposed from the opening 9 are removed, whereby the conductive pattern 4 is exposed from the opening 9 and the exposed portion of the conductive pattern 4 is formed as the terminal portion 6. As a result of the etching, removes the portion of the semiconductive layer 13 formed on the upper surface of the insulating base layer 3 exposed from the insulating cover layer 5 and the portion of the semiconductive layer 13 formed on the upper surface of the metal supporting board 2 exposed from the insulating cover layer 5, whereby the semiconductive layer 13 of the antistatic barrier layer 11 has the entire upper surface thereof covered with the insulating cover layer 5.

Thereafter, as shown in FIG. 4(h), the metal plating layer 10 is formed on the upper surface of the terminal portion 6 as necessary, the metal supporting board 2 is cut away by chemical etching to form the gimbal 8, and then trimmed, whereby the suspension board with circuit 1 is obtained.

The metal plating layer 10 is made of a metal such as gold or nickel and formed by plating such as electrolytic plating or electroless plating. Preferably, gold is plated to form the metal plating layer 10 as a gold plating layer. The metal plating layer 10 may also be formed as a nickel/gold multi-plating layer by successively plating nickel and gold. The thickness of the metal plating layer 10 is in the range of, e.g., 0.5 to 2 μm.

In the suspension board with circuit 1 thus obtained, the antistatic barrier layer 11 comprises the metal thin film 12 and the semiconductive layer 13 formed on the metal thin film 12. Therefore, it is possible to effectively prevent ion migration in the conductive pattern 4, i.e., the diffusion of the metal for forming the conductive pattern 4 into the insulating cover layer 5 by means of the metal thin film 12. In addition, it is possible to set the surface resistance value of the antistatic barrier layer 11 to a value in the foregoing range required to remove the electrostatic charging of the terminal portion 6 by means of the semiconductive layer 13.

As a result, the ion migration in the conductive pattern 4 and the electrostatic charging of the terminal portion 6 can be prevented simultaneously and effectively. It is also possible to simultaneously and effectively prevent the degradation of the conductive pattern 4 and a short circuit between the conductive pattern 4 as well as the electrostatic breakdown of the mounted electronic component.

Moreover, since the semiconductive layer 13 of the antistatic barrier layer 11 is covered with the insulating cover layer 5, the stripping off of the semiconductive layer 13 can be prevented. This makes it possible to prevent the desorbed semiconductive layer 13 from being scattered as a foreign matter.

Although the antistatic barrier layer 11 is formed of the metal thin film 12 and the semiconductive layer 13 formed on the metal thin film 12 in the suspension board with circuit 1 described above, it is also possible to form the antistatic barrier layer 11 of the semiconductive layer 13 and the metal thin film 12 formed on the semiconductive layer 13 by inverting the respective positions thereof

EXAMPLES

The present invention is described more specifically by showing the example and comparative examples herein below. However, the present invention is by no means limited to the example and the comparative examples.

Example 1

After a metal supporting board made of a stainless steel foil with a thickness of 25 μm was prepared (see FIG. 3(a)), a varnish of a photosensitive polyamic acid resin separately prepared was coated on the upper surface of the metal supporting board. The coated varnish was dried, exposed to light via a photomask, and then developed to form a pattern in which the outer peripheral edge of the upper surface of the metal supporting board was partly exposed. Then, the formed pattern was cured by heating to form a insulating base layer made of a polyimide resin having a thickness of 10 μm (see FIG. 3(b)).

Subsequently, a conductive pattern made of copper having a thickness of 10 μm was formed by an additive method on the upper surface of the insulating base layer to serve as a wired circuit pattern integrally formed with terminal portions and wires (see FIG. 3(c)).

Thereafter, a metal thin film composed of a nickel thin film having a thickness of 0.15 μm was formed continuously on the upper and side surfaces (including the lower end portion laminated on the upper surface of the insulating base layer) of the conductive pattern to cover the conductive pattern by electroless nickel plating (see FIG. 3(d)).

The formation of the metal thin film was confirmed by ESCA.

Then, a sputtering coating composed of a chromium thin film was formed continuously on the upper and side surfaces of the metal thin film, the upper and side surfaces of the insulating base layer exposed from the metal thin film, and the upper surface of the metal supporting board exposed from the insulating base layer by sputtering using chromium as a target.

The sputtering was performed under the following sputtering conditions by the same method as described above.

Target: Cr
Ultimate of Vacuum: $1.33 \times 10^{-3}$ Pa
Flow Rate of Introduced Gas (Ar): $2.0 \times 10^{-3}$ m$^3$/hour
Operating Pressure: 0.16 Pa
Temperature of Earth Electrode: 20° C.
Electric Power: DC 180 W
Sputtering Time: 4 Seconds
Thickness of Sputtering Coating: 0.01 μm Then, the surface of the sputtering coating composed of the chromium thin film was oxidized by heating in an atmosphere at 125° C. for twelve hours to form a semiconductive layer composed of a chromium oxide layer (see FIG. 4(e)).

The formation of the semiconductive layer was confirmed by ESCA. As a result of measuring the surface resistance value of the semiconductive layer (the portion formed on the upper and side surfaces of the insulating base layer and the upper surface of the metal supporting board) at a temperature of 25° C. and a humidity of 15% using a surface resistance measuring device (Hiresta-up MCP-HT450 available from Mitsubishi Chemical Corporation), it was $1 \times 10^9$ Ω/□. The surface resistance value of the antistatic barrier layer (laminating portion composed of the metal thin film and the semiconductive layer) was $1 \times 10^7$ Ω/□.

Then, a varnish of a photosensitive polyamic acid resin was coated over the entire surface of the semiconductive layer, exposed to light via a photomask, heated at 190° C., and then developed to form a cover coating. The cover coating was heated at 380° C. for two hours to be cured, thereby forming an insulating cover layer in a pattern in which an opening was formed and the outer peripheral edge of the outer peripheral portion on the other longitudinal side was exposed (see FIG. 4(f).

Subsequently, the respective portions are etched such as the semiconductive layer and the metal thin film exposed from the opening in the insulating cover layer, the portion of the semiconductive layer formed on the upper surface of the insulating base layer exposed from the insulating cover layer, and the portion of the semiconductive layer formed on the upper surface of the metal supporting board exposed from the insulating cover layer (see FIG. 4(g)).

As the etching, wet etching was performed using the insulating cover layer as an etching resist to the portion of the antistatic barrier layer to be etched.

Thereafter, a gold plating layer was formed by electroless gold plating on the upper surface of the terminal portion, a gimbal was formed by cutting away the metal supporting board by chemical etching, and then trimmed to obtain the suspension board with circuit (see FIG. 4(h)).

Comparative Example 1

A suspension board with circuit was obtained in the same manner as in EXAMPLE 1 except that the metal thin film was not provided. That is, the semiconductive layer of the antistatic barrier layer was formed continuously on the upper and side surfaces of the conductive pattern, the upper and side surfaces of the insulating base layer exposed from the conductive pattern, and the upper surface of the metal supporting board exposed from the insulating base layer.

Comparative Example 2

A suspension board with circuit was obtained in the same manner as in EXAMPLE 1 except that a metal layer composed of an aluminum layer was formed in place of the semiconductive layer composed of the chromium oxide layer.

The aluminum layer was formed by a vapor deposition method based on the description of Japanese Unexamined Patent Publication No. 08-153940.

The surface resistance value of the metal layer (the portion formed on the upper and side surfaces of the insulating base layer and the upper surface of the metal supporting board) was $1 \times 10^8$ Ω/□.

However, when a magnetic head was mounted on the suspension board with circuit, a misoperation occurred in the magnetic head.

(Evaluation)
(1) Charging of Terminal Portion

In each of the suspension boards with circuits obtained in Example 1 and Comparative Example 1, an amount of charge at the terminal portion was measured using a coulomb meter (NK-1001 available from Kasuga Electric Works Ltd.).

As a result, the measured amount of charge was 0 nQ in each of Example 1 and Comparative Example 1.

(2) Ion Migration

In each of the suspension boards with circuits obtained in Example 1 and Comparative Example 1, ion migration was evaluated by measuring an elapsed time until inter-wires resistance reached a value of not more than $1 \times 10^5$ Ω/□ when a test atmosphere was set at a temperature of 85° C. and a humidity of 85% and a voltage of 6 V was applied between the wires.

As a result, in Example 1, the inter-wires resistance did not reach a value of not more than $1 \times 10^5$ Ω/□ even after 1000 hours or more elapsed. In Comparative Example 1, by contrast, the inter-wires resistance reached a value of not more than $1 \times 10^5$ Ω/□ when 650 hours elapsed.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A suspension board with circuit, comprising:
   a metal supporting board;
   an insulating layer formed on the metal supporting board;
   a conductive pattern formed on the insulating layer and including a terminal portion for connecting to an external terminal;
   a metal plating layer formed on a surface of the terminal portion; and
   an antistatic barrier layer formed on the conductive pattern,
   wherein the antistatic barrier layer includes a metal thin film and a semiconductive layer;
   wherein the metal thin film is formed continuously on upper and side surfaces of the conductive pattern except the terminal portion;
   wherein the semiconductive layer is formed continuously on upper and side surfaces of the metal thin film, and upper and side surfaces of the insulating layer exposed from the metal thin film;
   wherein the semiconductive layer comprises at least one end facing the terminal portion and at least the other end in contact with the metal supporting board; and
   wherein the one end of the semiconductive layer is electrically connected to the conductive pattern via the metal plating layer and the metal thin film, and the other end of the semiconductive layer is electrically connected to the metal supporting board.

2. The suspension board with circuit according to claim 1, wherein the metal thin film is a nickel thin film.

3. The suspension board with circuit according to claim 1, wherein the semiconductive layer is a chromium oxide layer.

4. The suspension board with circuit according to claim 1, further comprising:
   an insulating cover layer formed on the antistatic barrier layer to cover the conductive pattern.

5. The suspension board with circuit according to claim 4, wherein the insulating cover layer comprises an opening which extends therethrough in correspondence with the terminal portion, and wherein the metal plating layer fills the opening so as to come in contact with the metal thin film and the semiconductive layer at an aperture edge of the opening in the insulating cover layer.

* * * * *